US005336957A

United States Patent [19]

Yamanouchi et al.

[11] Patent Number: 5,336,957

[45] Date of Patent: Aug. 9, 1994

[54] SURFACE ACOUSTIC WAVE CONVOLVER

[75] Inventors: Kazuhiko Yamanouchi, 37-13, Matsugaoka, Taihaku-ku, Sendai-shi, Miyagi-ken; Norihito Mihota, Sendai; Shunji Kato, Ageo; Hiromu Terada; Junichi Ogata, both of Sendai, all of Japan

[73] Assignees: Mitsui Mining & Smelting Co., Ltd., Tokyo; Kazuhiko Yamanouchi, Miyagi, both of Japan

[21] Appl. No.: 993,112

[22] Filed: Dec. 18, 1992

[30] Foreign Application Priority Data

Jul. 24, 1992 [JP] Japan .................................. 4-217371

[51] Int. Cl.[5] .............................................. H01L 41/08

[52] U.S. Cl. ........................... 310/313 D; 310/313 C; 310/313 B; 364/821

[58] Field of Search ........... 310/313 R, 313 B, 313 C, 310/313 D; 333/153, 154, 196; 364/821

[56] References Cited

U.S. PATENT DOCUMENTS 4,473,888 9/1984 Smith et al. ................ 310/313 R X

FOREIGN PATENT DOCUMENTS 3812598 10/1988 Fed. Rep. of Germany .

2570902 3/1986 France .

OTHER PUBLICATIONS

IEEE Transactions on Microwave Theory and Techniques, vol. MTT20, No. 2, Feb. 1972, New York US pp. 188–192.

IEE Proceedings A. Physical Science, Measurement & Instrumentation, Management & Education, vol. 131, No. 4, Jun. 1984, Stevenage GB pp. 186–215.

*Primary Examiner*—Mark O. Budd

*Attorney, Agent, or Firm*—Bucknam and Archer

[57] ABSTRACT

A surface acoustic wave convolver includes first and second interdigital electrodes for exciting surface acoustic waves and an output electrode for detecting the surface acoustic waves to extract a convolution output as an electrical signal, the first and second interdigital electrodes and the output electrode being formed on a piezoelectric or electrostrictive substrate. In order to improve convolution efficiency and obtain wide-range characteristics, each of the first and second interdigital electrodes has a predetermined thickness, the first interdigital electrode is arranged such that positive and negative electrodes are alternately arranged so as to have electrode widths and periods which are gradually decreased toward the output electrode, the second interdigital electrode is arranged such that positive and negative electrodes are alternately arranged so as to have electrode widths and periods which are gradually increased toward the output electrode, and the second interdigital electrode has a double electrode structure in addition, in order to reduce ripples in frequency characteristics, the output electrode are divided into a plurality of pieces, and two end portion of each of the first and second interdigital electrodes are weighted.

20 Claims, 9 Drawing Sheets

DOWN CHIRP + IDT

UP CHIRP + IDT

SURFACE ACOUSTIC WAVE CONVOLVER

BACKGROUND OF THE INVENTION

1. Field of the Invention

The present invention relates to a surface acoustic wave convolver in which surface acoustic wave transducers respectively provided with interdigital electrodes having different electrode widths and periods (pitches) in a direction of propagation of a surface acoustic wave are combined.

2. Description of the Prior Art

A conventional surface acoustic wave transducer having interdigital electrode each comprising positive and negative electrodes formed on a piezoelectric substrate (including a piezoelectric thin film substrate) or electrostrictive substrate generally has an electrode layout structure in which the positive and negative electrodes are arranged at equal periods. FIG. 9(*a*) is a plan view showing a surface acoustic wave convolver using conventional surface acoustic wave transducers, and FIG. 9(*b*) is a sectional view thereof along the line X–Y in FIG. 9(*a*). Referring to FIGS. 9(*a*) and 9(*b*), reference numeral 51 denotes a first surface acoustic wave transducer for converting an electrical signal into a surface acoustic wave; 52, a second surface acoustic wave transducer for converting an electrical signal similar to the one described above into a surface acoustic wave; and 53, an output electrode for detecting the surface acoustic waves generated and propagating from the surface acoustic wave transducers 51 and 52 to extract a convolution output as an electrical signal. Each interdigital electrode of the surface acoustic wave transducer 51 or 52 has an electrode layout structure in which the positive and negative electrodes are arranged at equal periods. That is, if an electrode width in the interdigital electrode is defined as m and a period is defined as p, the period p is constant. In addition, ratios m/p are constants (mostly 0.5) regardless of positions on the interdigital electrode.

In the surface acoustic wave transducer having this electrode layout structure, surface acoustic waves generated by this transducer propagate to the right and left with substantially the same amplitude. Thus, this surface acoustic wave transducer has similar insertion loss characteristics in the tow directions, i.e., so-called bi-directional characteristics.

Conventional techniques each for obtaining a uni-directional surface acoustic wave transducer having a low insertion loss in only one direction by using an electrode layout structure in which the positive and negative electrodes are arranged at equal periods are exemplified by a method using a 120° phase shifter, a method using a 90° phase shifter, and a method of obtaining an internal reflection type uni-directional transducer in which reflection electrodes are asymmetrically arranged between positive and negative electrodes at equal periods.

The surface acoustic wave transducer having the electrode layout structure in which the positive and negative electrodes are arranged at equal periods has bi-directional characteristics but cannot provide characteristics having a low insertion loss in only one direction. Even if such surface acoustic wave transducers are used to constitute a surface acoustic wave convolver, the convolver does not have high convolution efficiency. In the method of obtaining the uni-directional surface acoustic wave transducer, characteristics having a low insertion loss in only one direction can be obtained. However, since the surface acoustic wave transducers each having the electrode layout structure in which the positive and negative electrodes are arranged at equal periods are used, wide-range characteristics cannot be obtained. Therefore, a surface acoustic wave convolver employing this surface acoustic wave transducer cannot provide wide-range characteristics, either.

SUMMARY OF THE INVENTION

The present invention has been made in consideration of the conventional problems described above, and has at its first object to provide a surface acoustic wave convolver having high convolution efficiency and wide-range characteristics.

In order to achieve the first object according to the first aspect of the present invention, there is provided a surface acoustic wave convolver having first and second interdigital electrodes for exciting surface acoustic waves and an output electrode for detecting the surface acoustic waves to extract a convolution output as an electrical signal, the first and second interdigital electrodes and the output electrode being formed on a piezoelectric or electrostrictive substrate, wherein each of the first and second interdigital electrodes has a predetermined thickness, the first interdigital electrode is arranged such that positive and negative electrodes are alternately arranged so as to have electrode widths and periods which are gradually decreased toward the output electrode, the second interdigital electrode is arranged such that positive and negative electrodes are alternately arranged so as to have electrode widths and periods which are gradually increased toward the output electrode, the first interdigital electrode has a single electrode structure and the second interdigital electrode has a double electrode structure.

A surface acoustic wave transducer in which positive and negative electrodes having different periods (graded periodicity) in the direction of propagation are arranged, a large thickness can be made such that the phase of excitation is the same as the phase of reflection at an electrode in one direction of propagation but is opposite to the phase of reflection in the other direction of propagation. Such a surface acoustic wave transducer has uni-directional characteristics (uni-directivity). A pair of surface acoustic wave transducers each having uni-directivity are aligned such that the directivity of one surface acoustic wave transducer is matched with that of the other surface acoustic wave transducer, and an output electrode is interposed between these surface acoustic wave transducers, thereby obtaining a surface acoustic wave convolver. In particular, in the above arrangement, when the second interdigital electrode has a double electrode structure, the second interdigital electrode has bi-directional characteristics, thereby obtaining a convolver having high convolution efficiency.

The surface acoustic wave convolver having the above arrangement has higher convolution efficiency and better wide-range characteristics than those of the conventional convolver. In addition, when the inputs and outputs of the convolver according to the present invention are matched with the higher precision with external circuits with which the inputs and outputs are connected, the insertion loss can be further reduced by 3 to 4 dB. In this surface acoustic wave convolver, however, excellent matching between the inputs/outputs and the external circuits causes to produce relatively large ripples in frequency characteristics, resulting in inconvenience.

It is the second object of the present invention to provide a surface acoustic wave convolver having wide-range characteristics and smaller ripples in frequency characteristics even if good matching between the inputs/outputs and the external circuits is performed to further improve convolution efficiency.

In order to achieve the second object according to the second aspect of the present invention, there is provided a surface acoustic wave convolver having first and second interdigital electrodes for exciting surface acoustic waves and an output electrode for detecting the surface acoustic waves to extract a convolution output as an electrical signal, the first and second interdigital electrodes and the output electrode being formed on a piezoelectric or electrostrictive substrate, wherein each of the first and second interdigital electrodes has a predetermined thickness, the first interdigital electrode is arranged such that positive and negative electrodes are alternately arranged so as to have electrode widths and periods which are gradually decreased toward said output electrode, the second interdigital electrode is arranged such that positive and negative electrodes are alternately arranged so as to have electrode widths and periods which are gradually increased toward said output electrode, wherein the output electrode is divided into a plurality of pieces, and two end portions of the first and second interdigital electrodes are weighted. The interdigital electrode having electrode widths and periods which are gradually changed is called a diffusion type interdigital electrode as opposed to the interdigital electrode in which the positive and negative electrodes are arranged at equal periods.

For example, a so-called apodizing method of changing an effective excitation opening length (overlap width) is used as a weighting method.

As described above, since the output electrode is divided into the plurality of pieces and the two end portions of the first and second interdigital electrodes are weighted, ripples in the frequency characteristics can be reduced, and inputs to and outputs from both the interdigital electrodes can be matched better than before, thereby further improving the convolution efficiency.

BRIEF DESCRIPTION OF THE DRAWINGS

FIG. 7(*b*) is a graph showing frequency characteristics of the surface acoustic wave transducer in FIG. 1 in place of that in FIG. 5;

DETAILED DESCRIPTION OF THE PREFERRED EMBODIMENTS

Preferred embodiments of the present invention will be described with reference to the accompanying drawings.

First Embodiment

Figure 1:
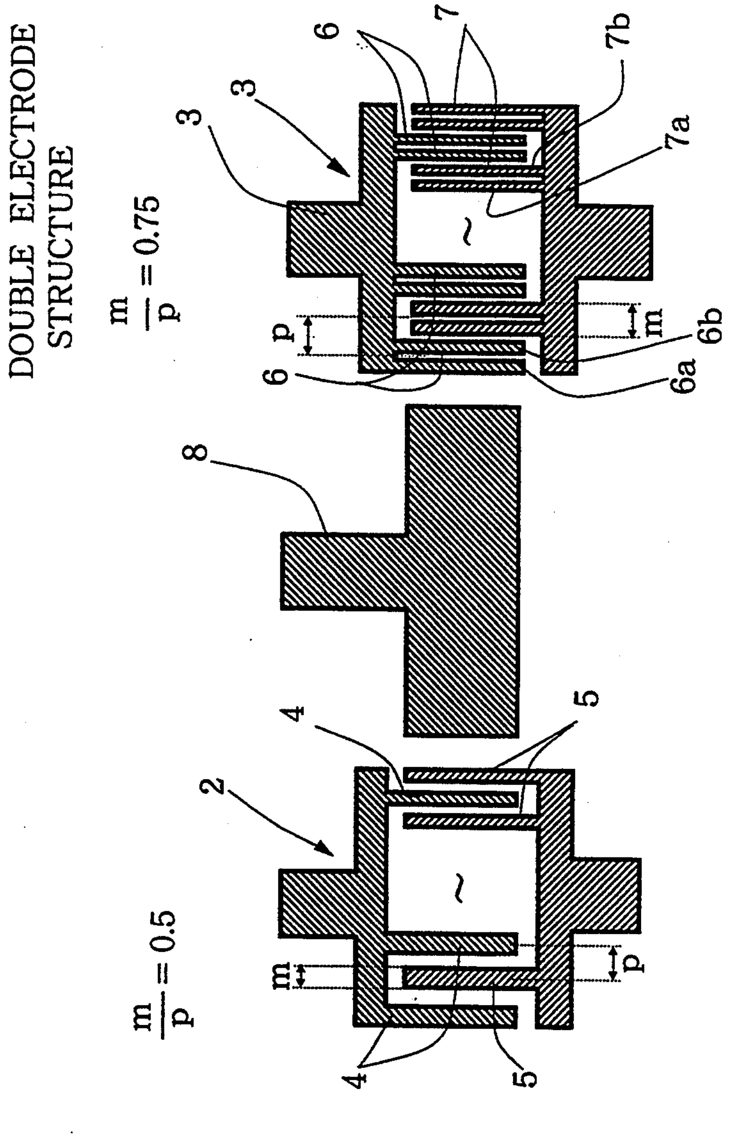
FIG. 1 is a plan view of a surface acoustic wave convolver according to the first embodiment of the present invention.

FIG. 1 is a plan view of a surface acoustic wave convolver according to the first embodiment of the present invention.

Referring to FIG. 1, reference numeral 1 denotes a piezoelectric substrate; 2, a first excitation-side surface acoustic wave transducer formed on the piezoelectric substrate 1; and 3, a second excitation-side surface acoustic wave transducer formed on the piezoelectric substrate 1. The first surface acoustic wave transducer 2 has positive and negative electrodes 4 and 5 (first interdigital electrode). The second surface acoustic wave transducer 3 has positive and negative electrodes 6 and 7 (second interdigital electrode). Reference numeral 8 denotes an output electrode. The positive and negative electrodes 4 and 5 are alternately arranged so that electrode widths m and periods p are gradually decreased toward the output electrode 8. A ratio m/p in the first interdigital electrode is set to be m/p=0.5. The positive and negative electrodes 6 and 7 are alternately arranged so that electrode widths m and periods p are gradually increased toward the output electrode 8. The second interdigital electrode has a double electrode structure. One positive electrode 6 has two electrode pieces 6*a* and 6*b*, and one negative electrode 7 has two electrode pieces 7*a* and 7*b*. The width of each of the electrode pieces in the second interdigital electrode is defined as 0.25 p. In other words, the second interdigital electrode is obtained such that each electrode of a normal interdigital electrode for m/p=0.75 is divided into two pieces to have equal electrode widths and equal gaps between the divided pieces, thereby obtaining the double electrode structure. Note that Y-cut Z-propagation lithium niobate is used to form the piezoelectric substrate 1, and an aluminum film is used to form the electrodes 4, 5, 6, and 7.

By using these electrodes, the first interdigital electrode has a strong directivity toward the output electrode 8, while the second interdigital electrode does not have any strong directivity toward the output electrode 8. In particular, the interdigital electrode having the double electrode structure has almost bi-directional characteristics, thereby obtaining a convolver having high convolution efficiency. By employing the double electrode structure, the electrode width becomes $\lambda/8$ in this embodiment, and the second interdigital electrode can be manufactured without posing any problem in a practical frequency range. In this case, condition $0 \leq m/p < 0.5$ is also incorporated as the range of ratios m/p in the present invention.

The present inventors have found that reflection at the interdigital electrode formed on the piezoelectric substrate is positively utilized to give a directivity to a surface acoustic wave transducer, thereby constituting a surface acoustic wave convolver having high convolution efficiency in a wide range by utilizing this directivity of the surface acoustic wave transducer. In this case, each interdigital electrode must have a given thickness to reflect the surface acoustic wave thereat. A thickness H of each interdigital electrode preferably falls within the range of $0.01 \leq H/\lambda \leq 0.10$ where λ is the wavelength of the surface acoustic wave.

The directivity of the surface acoustic wave transducer is determined in accordance with a Zm/Zg value where Zm is the acoustic impedance of the interdigital electrode metal and Zg is the acoustic impedance of the electrode gap.

Figure 2:
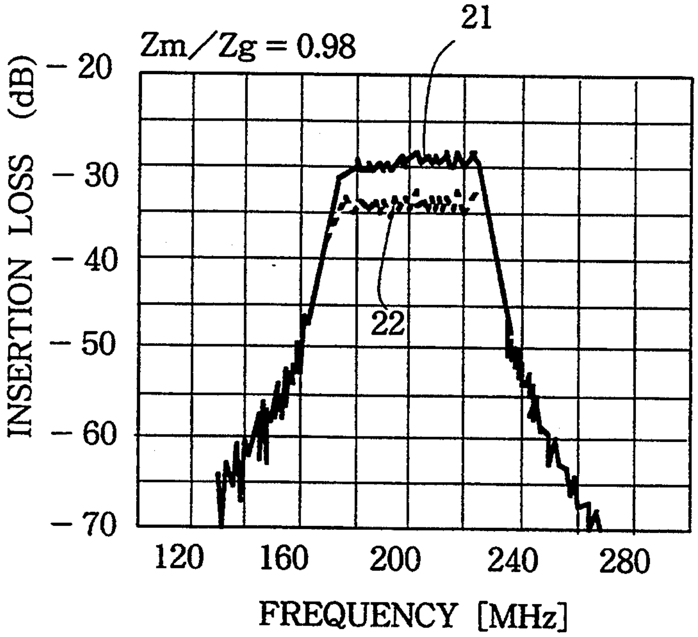
FIGS. 2(*a*) shows the frequency characteristics of a chirp interdigital transducer of Zm/Zg=0.98 for explaining the directivity thereof and FIGS. 2(*b*) and 2(*c*) show the electrode layouts thereof.
Figure 2:
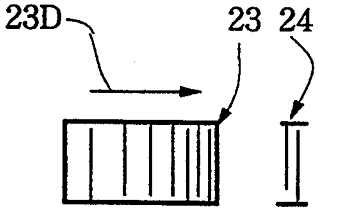
Figure 2:
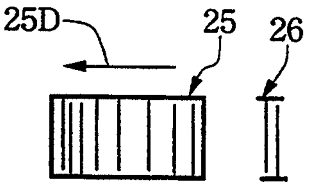

FIG. 2(*a*) shows the frequency characteristics of a chirp interdigital electrode (interdigital transducer) for explaining the directivity thereof by way of analysis of an equivalent circuit when the thickness of each aluminum electrode is set to be 2,000 angstrom and the ratio Zm/Zg is set to be 0.98, and FIGS. 2(*b*) and 2(*c*) show the electrode layouts thereof. As shown in FIG. 2(*b*), when a down-chirp interdigital electrode (interdigital transducer, referred to as IDT in FIG. 2(*b*)) 23 having positive and negative electrodes whose density is gradually increased is located adjacent to an IDT 24 having a pair of positive and negative electrodes, the frequency characteristic represented by a solid curve 21 shown in FIG. 2(*a*) can be obtained. However, when an up-chirp IDT 25 having positive and negative electrodes whose density is gradually decreased is located adjacent to an IDT 26 having a pair of positive and negative electrodes, as shown in FIG. 2(*c*), the frequency characteristic represented by a broken curve 22 in FIG. 2(*a*) can be obtained. The frequency characteristic represented by the solid curve 21 is better than that represented by the broken curve 22. Therefore, the IDT 23 exhibits the directivity indicated by an arrow 23D, while the IDT 25 has the directivity indicated by an arrow 25D.

Figure 3:
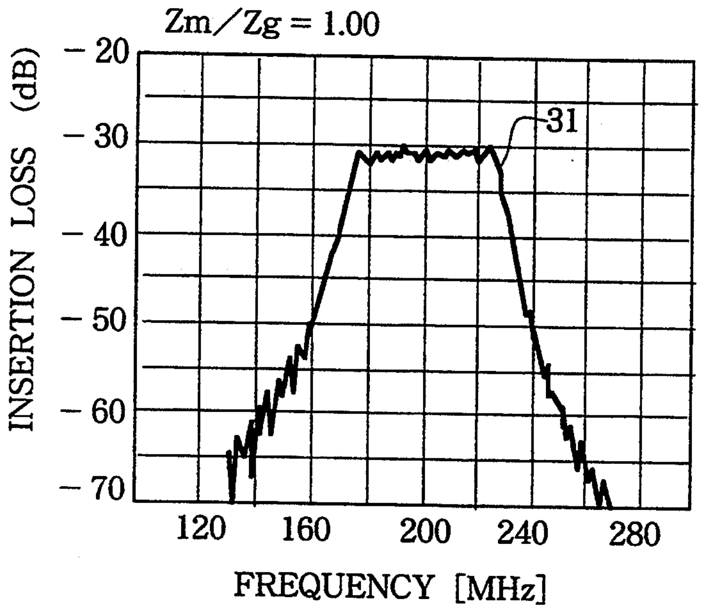
FIGS. 3(*c*) shows the frequency characteristics of a chirp interdigital transducer of Zm/Zg=1.00 for explaining the directivity thereof and FIGS. 3(*b*) and 3(*c*) show the electrode layouts thereof.
Figure 3:
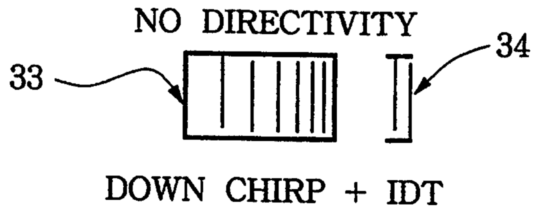
Figure 3:
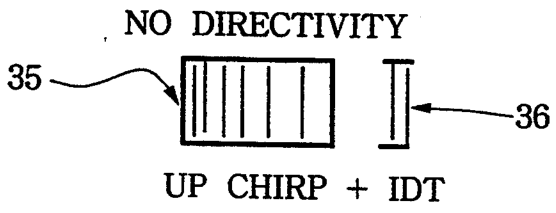

FIG. 3(*a*) shows the frequency characteristics of a chirp IDT for explaining the directivity thereof by way of analysis of an equivalent circuit when the thickness of each aluminum electrode is set to be 2,000 angstrom and the ratio Zm/Zg is set to be 1.00, and FIGS. 3(*b*) and 3(*c*) show the electrode layouts thereof. As shown in FIG. 3(*b*), when a down-chirp IDT 33 having positive and negative electrodes whose density is gradually increased is located adjacent to an IDT 34 having a pair of positive and negative electrodes, the frequency characteristic represented by a solid curve 31 shown in FIG. 3(*a*) can be obtained. Even when an up-chirp IDT 35 having positive and negative electrodes whose density is gradually decreased is located adjacent to an IDT 36 having a pair of positive and negative electrodes, as shown in FIG. 3(*c*), the frequency characteristic represented by the solid curve 31 in FIG. 3(*a*) can be obtained. In this case, neither the IDT 33 nor the IDT 35 has directivity.

Figure 4:
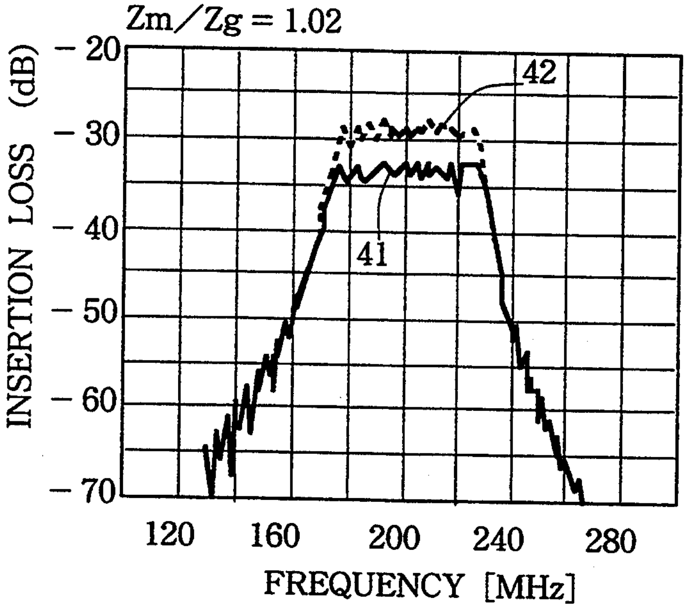
FIGS. 4(*a*) shows the frequency characteristics of a chirp interdigital transducer of Zm/Zg=1.02 for explaining the directivity thereof and FIGS. 4(*b*) and 4(*c*) show the electrode layouts thereof.
Figure 4:
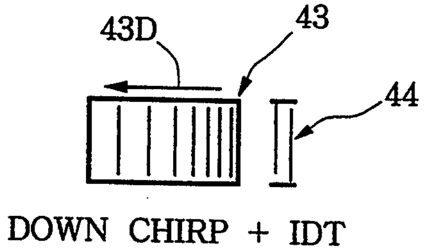
Figure 4:
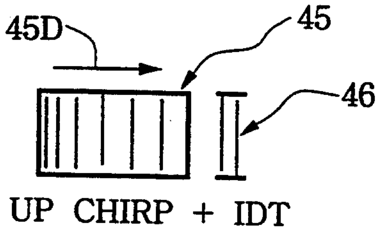

FIG. 4(*a*) shows the frequency characteristics of a chirp IDT for explaining the directivity thereof by way of analysis of an equivalent circuit when the thickness of each aluminum electrode is set to be 2,000 angstrom and the ratio Zm/Zg is set to be 1.02, and FIGS. 4(*b*) and 4(*c*) show the electrode layouts thereof. As shown in FIG. 4(*b*), when a down-chirp IDT 43 having positive and negative electrodes whose density is gradually increased is located adjacent to an IDT 44 having a pair of positive and negative electrodes, the frequency characteristic represented by a solid curve 41 shown in FIG. 4(*a*) can be obtained. However, when an up-chirp IDT 45 having positive and negative electrodes whose density is gradually decreased is located adjacent to an IDT 46 having a pair of positive and negative electrodes, as shown in FIG. 4(*c*), the frequency characteristic represented by a broken curve 42 in FIG. 4(*a*) can be obtained. The frequency characteristic represented by the broken curve 42 is better than that represented by the solid curve 41. Therefore, the IDT 43 has the directivity indicated by an arrow 43D, while the IDT 45 exhibits the directivity indicated by an arrow 45D.

As a result of the examination of directivities of chirp interdigital electrodes (IDTs) under various conditions, a chirp interdigital electrode (IDT) has a directivity to increase the density of the positive and negative electrodes for $Zm/Zg < 1$, does not have any directivity for $Zm/Zg = 1$, or has a directivity to decrease the density of the positive and negative electrodes for $Zm/Zg > 1$. When a convolver is arranged in consideration of the directivities of the interdigital electrodes, the resultant convolver can have a low insertion loss and wide-range characteristics. It is most preferable that interdigital electrodes each having uni-directional characteristics are arranged to cause the directivity of one interdigital electrode to oppose that of the other interdigital electrode. However, in order to eliminate dispersion, the other interdigital electrode preferably has bi-directional characteristics. That is, one interdigital electrode has a directivity toward the output electrode, while the other interdigital electrode has bi-directional characteristics.

Second Embodiment

Figure 5:
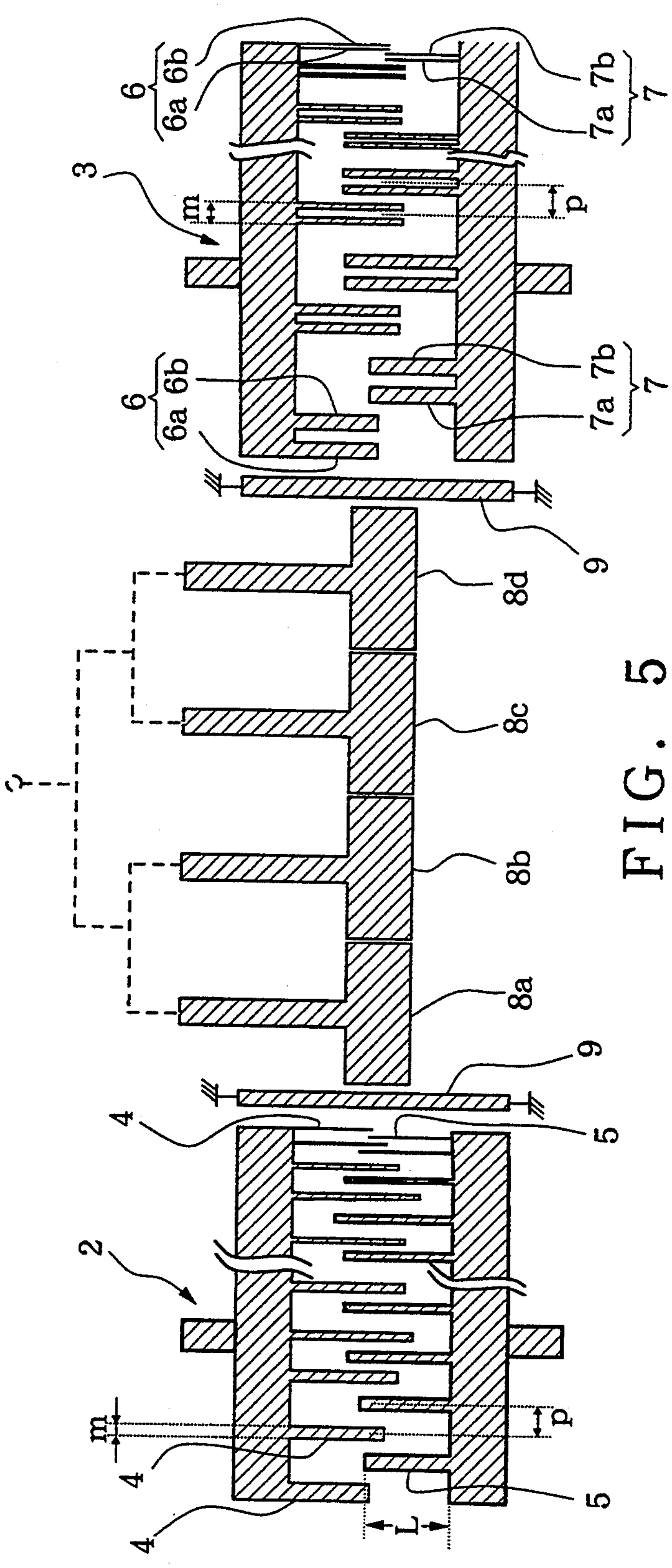
FIG. 5 is a plan view of a surface acoustic wave convolver according to the second embodiment of the present invention.
Figure 6:
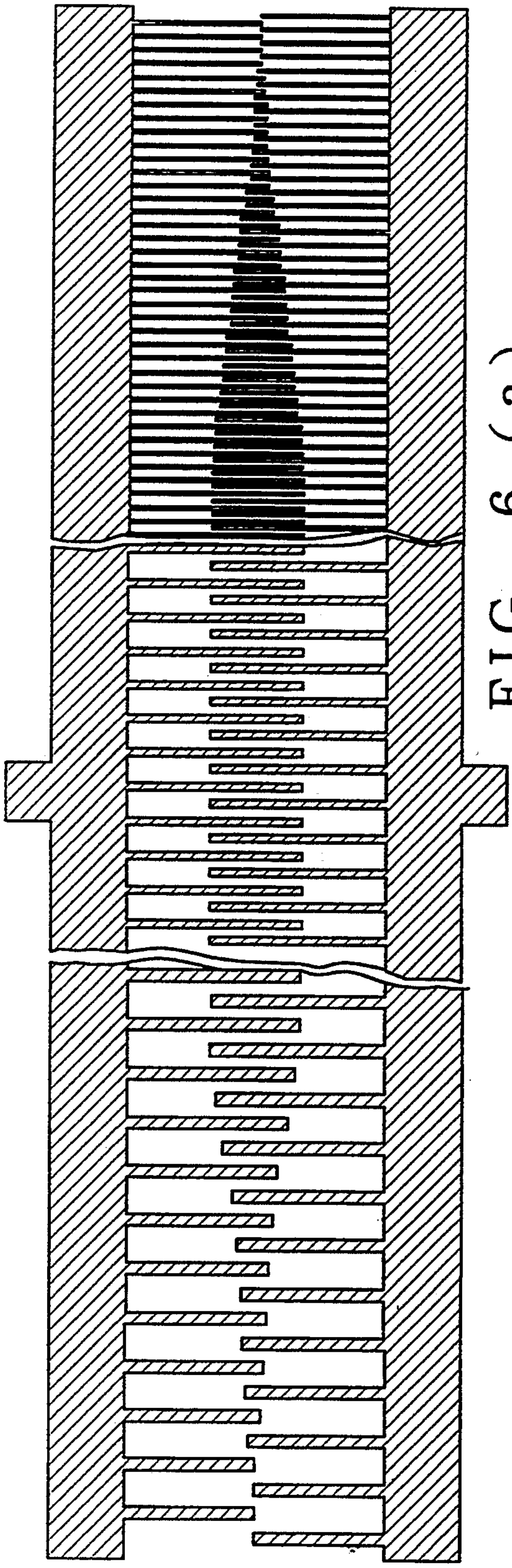
FIGS. 6(*a*) and 6(*b*) are views, respectively, showing first and second interdigital electrodes in the convolver in FIG. 5 in detail.
Figure 6:
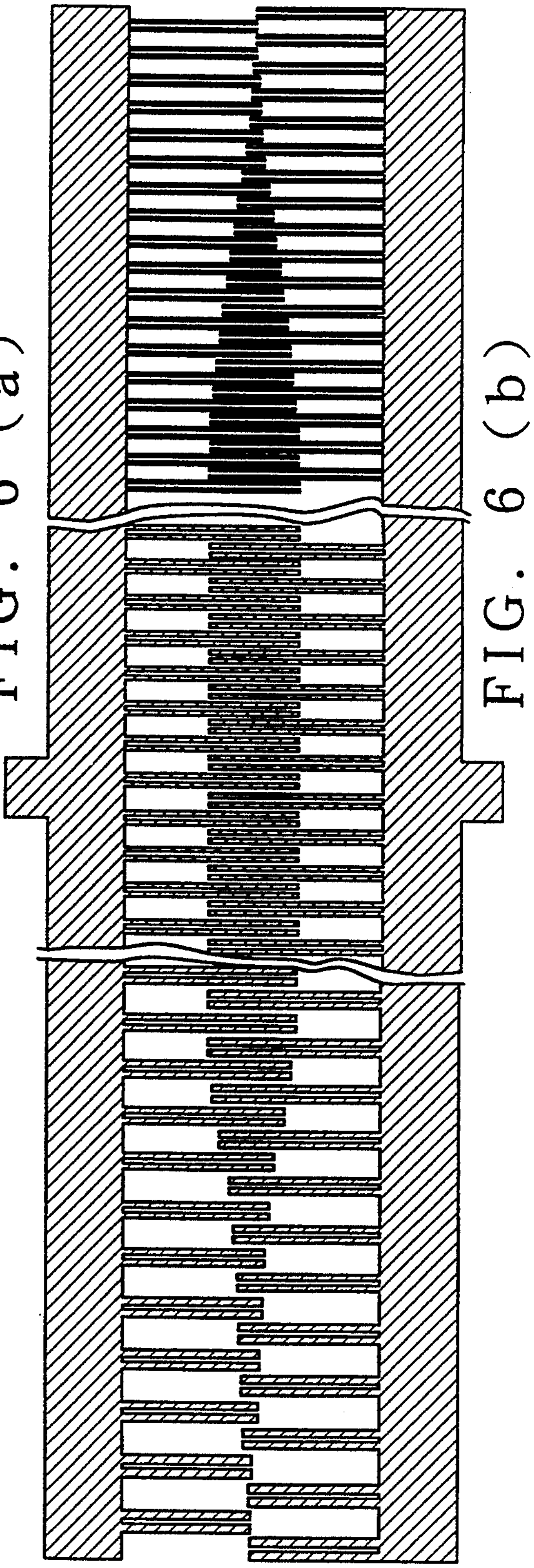

FIG. 5 is a plan view of a surface acoustic wave convolver according to the second embodiment of the present invention. The same reference numerals as in FIG. 1 denote the same parts in FIG. 5. Referring to FIG. 5, positive and negative electrodes 4 and 5 (first interdigital electrode) of a first surface acoustic wave transducer 2 are alternately arranged so that electrodes widths m and periods p thereof are gradually decreased toward an output electrode 8, and lengths L of the electrodes at the two end portions of the surface acoustic wave transducer 2 are gradually decreased from central sides to end sides, as shown in FIG. 6(*a*). The first interdigital electrode has a ratio $m/p = 0.5$. Positive and negative electrodes 6 and 7 (second interdigital electrode) of a second surface acoustic wave transducer 3 are alternately arranged so that electrodes widths m and periods p thereof are gradually increased toward the output electrode 8, and lengths L of the electrodes in the end portions of the surface acoustic wave transducer 3 are decreased in the direction from the central sides to the end sides, as shown in FIG. 6(*b*). In addition, the second interdigital electrode has a double electrode structure. One positive electrode 6 has two electrode pieces **6*a* and 6*b*, and one negative electrode 7 has two electrode pieces 7*a* and 7*b*. The width of each electrode piece in the second interdigital electrode is defined as 0.25 p. In other words, the second interdigital electrode is obtained such that each electrode of a normal interdigital electrode for $m/p = 0.75$ is divided into two pieces to have equal electrode widths and equal gaps between the divided pieces, thereby obtaining the double electrode structure. The output electrode 8 is divided into four pieces. Output electrode pieces 8***a* to 8*d* are connected in a so-called tournament such that the electrode pieces 8*a* and 8*b* are electrically connected to each other, the electrode pieces 8*c* and 8*d* are electrically connected to each other, and the set of the electrode pieces 8*a* and 8*b* is finally connected to the set of the electrode pieces 8*c* and 8*d*. Shielding plates (shields) 9 are arranged between the first surface acoustic wave transducer 2 and the output electrode 8 and between the second surface acoustic wave transducer 3 and the output electrode 8, respectively. Note that Y-cut Z-propagation lithium niobate is used as a piezoelectric substrate 1, and an aluminum film is used to form the electrodes 4, 5, 6, and 7. By using the first interdigital electrode 2 having the positive and negative electrodes 4 and 5 alternately arranged such that the electrode widths m and the periods p thereof are gradually reduced toward the output electrode 8 and the second interdigital electrode 3 having the positive and negative electrodes 6 and 7 alternately arranged such that the electrode widths m and the periods p thereof are gradually increased toward the output electrode 8, the first interdigital electrode can be made to have a strong directivity toward the output electrode, while the second interdigital electrode can be made not to have any strong directivity toward the output electrode. In this case, the directivity of the interdigital electrodes is weakened for $0<m/p<0.2$ and $0.7<m/p<1.0$. For this reason, an interdigital electrode satisfying condition $0.2\leqq m/p\leqq 0.7$ is used as the first interdigital electrode. An interdigital electrode of a single electrode structure satisfying conditions $0<m/p<0.3$ and $0.6<m/p<1.0$ or an interdigital electrode of a double electrode structure satisfying condition $0.6<m/p<1.0$ is used as the second interdigital electrode having almost bi-directional characteristics. In particular, the interdigital electrode having the double electrode structure exhibits almost bi-directional characteristics, and a convolver having high convolution efficiency can be obtained. The electrode width in this embodiment is $\lambda/8$, and the interdigital electrodes can be manufactured within the practical frequency range without posing any problem.

A thickness H of each interdigital electrode preferably falls within the range of $0.01\leqq H/\lambda\leqq 0.10$ where $\lambda$ is the wavelength of the surface acoustic wave. The chirp interdigital electrode whose electrode widths m and periods p are gradually changed in one direction has a directivity in a direction in which the density of the positive and negative electrodes increases for $Zm/Zg<1$ where Zm is the acoustic impedance of the metal film of the interdigital electrode and Zg is the acoustic impedance of the electrode gap, does not have any directivity for $Zm/Zg=1$, or has a directivity in a direction in which the density of the positive and negative electrodes decreases for $Zm/Zg>1$. For this reason, it is preferable that the ratio Zm/Zg of the first interdigital electrode 2 is set smaller than 1, and the ratio Zm/Zg of the second interdigital electrode 2 is set larger than 1. By arranging the first and second interdigital electrodes 2 and 3 as described above, the first interdigital electrode 2 can be made to have a directivity toward the output electrode 8, while the second interdigital electrode 3 has bi-directional characteristics. The convolution efficiency can be improved, i.e., the insertion loss can be reduced, and wide-range characteristics can be obtained.

In this embodiment, the first and second interdigital electrodes 2 and 3 are formed in a so-called apodized form. The positive and negative electrodes 4 and 5 of the first interdigital electrode 2 and the positive and negative electrodes 6 and 7 of the second interdigital electrode 3 are formed such that the lengths L of the electrodes at the two end portions of the surface acoustic wave transducers 2 and 3 are reduced from central side to end sides. That is, the overlap widths (effective excitation opening lengths) of the positive and negative electrodes are reduced. Since the first and second interdigital electrodes 2 and 3 are weighted in this manner, the ripples in the frequency characteristics can be reduced, and at the same time a decrease in insertion loss by an improvement in matching between the inputs and the outputs can be achieved.

Figure 7:
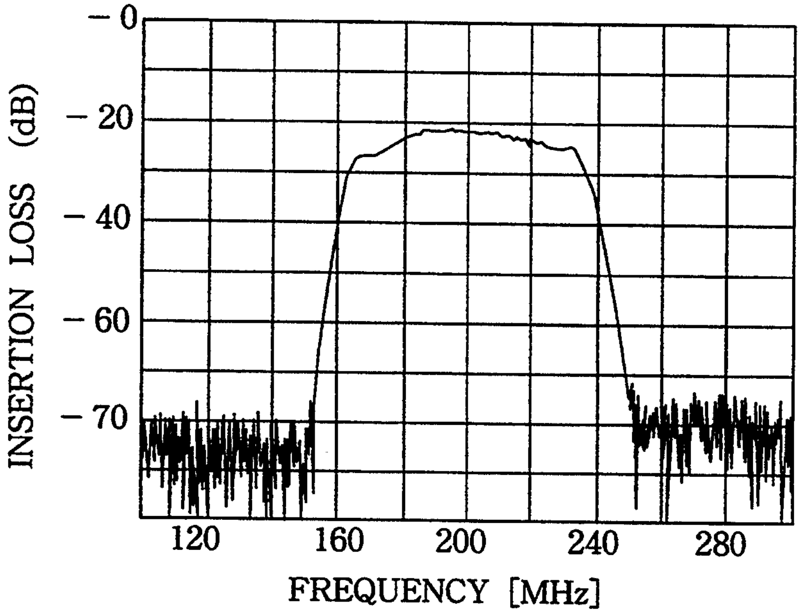
FIG. 7(*a*) is a graph showing frequency characteristics of the convolver shown in FIG. 5.
Figure 7:
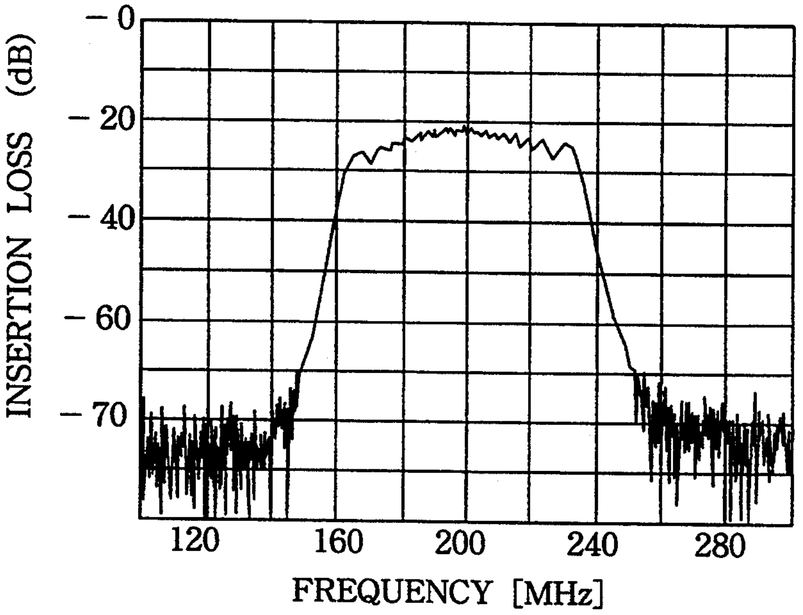

FIG. 7(*a*) shows frequency characteristics of the surface acoustic wave convolver shown in FIG. 5 which has the apodized interdigital electrodes 2 an 3, and FIG. 7(*b*) shows frequency characteristics of the surface acoustic wave convolver using non-apodized interdigital electrodes, i.e., the interdigital electrodes 2 and 3 having uniform effective excitation opening lengths as shown in FIG. 1. The ripples in the frequency characteristics are apparently reduced by the apodized interdigital electrodes 2 and 3.

Third Embodiment

Figure 8:
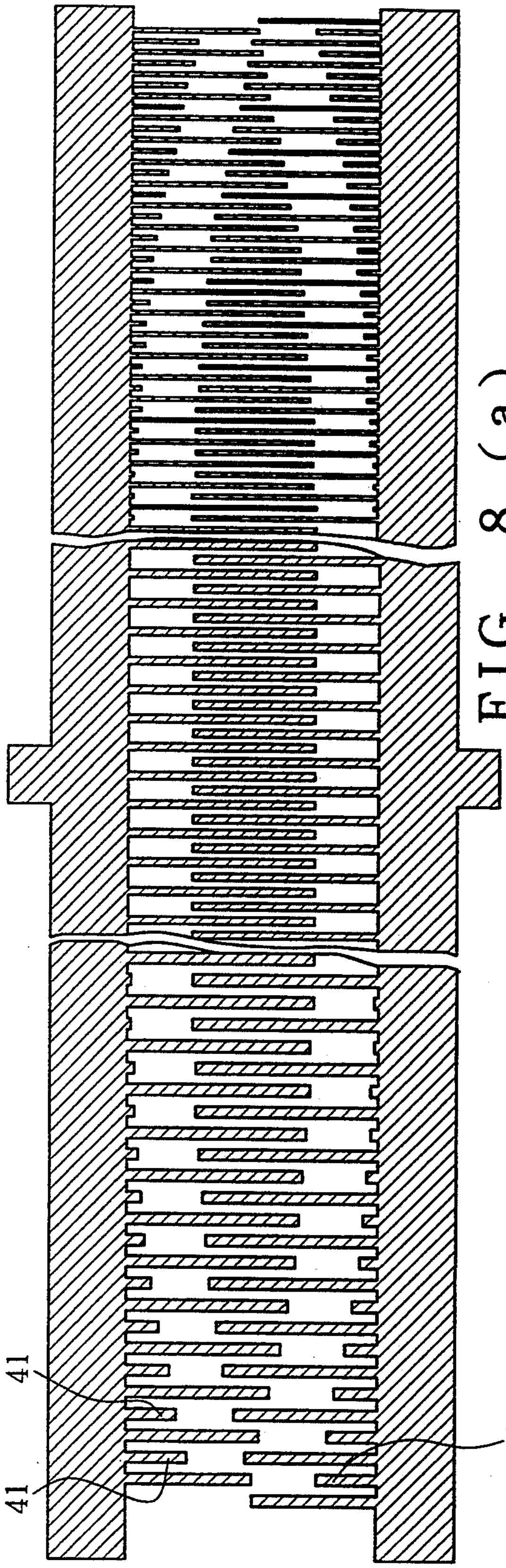
FIGS. 8(*a*) and 8(*b*) are views, respectively showing first and second interdigital electrodes in detail according to the third embodiment of the present invention.
Figure 8:
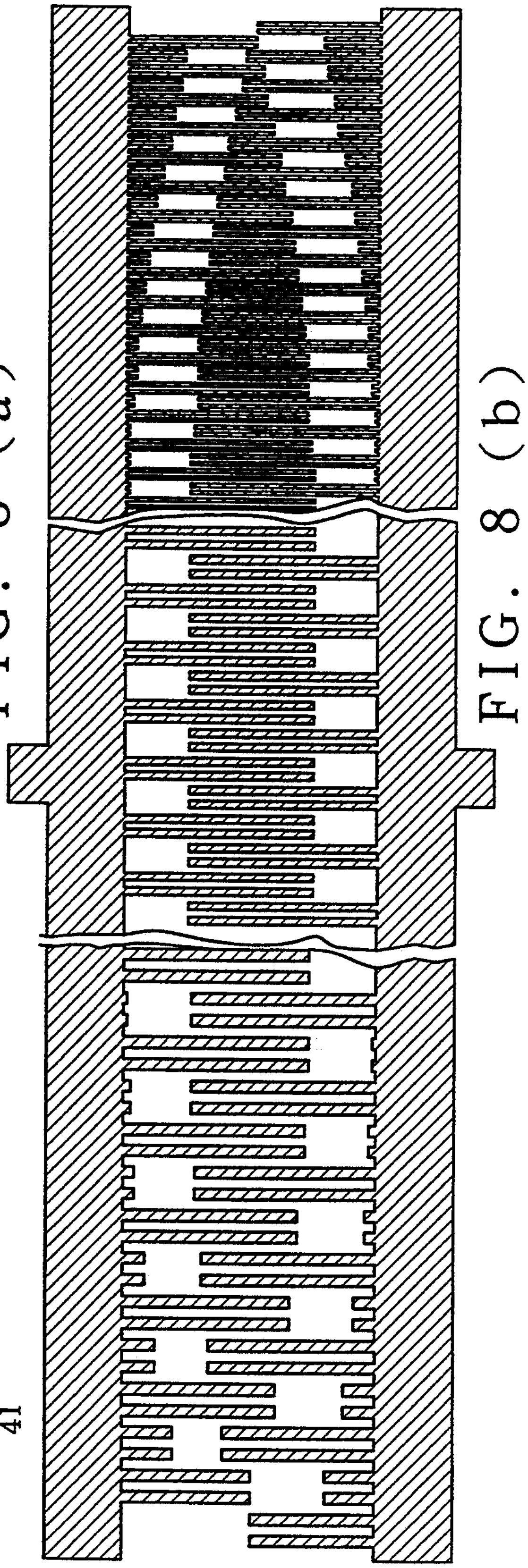
Figure 9:
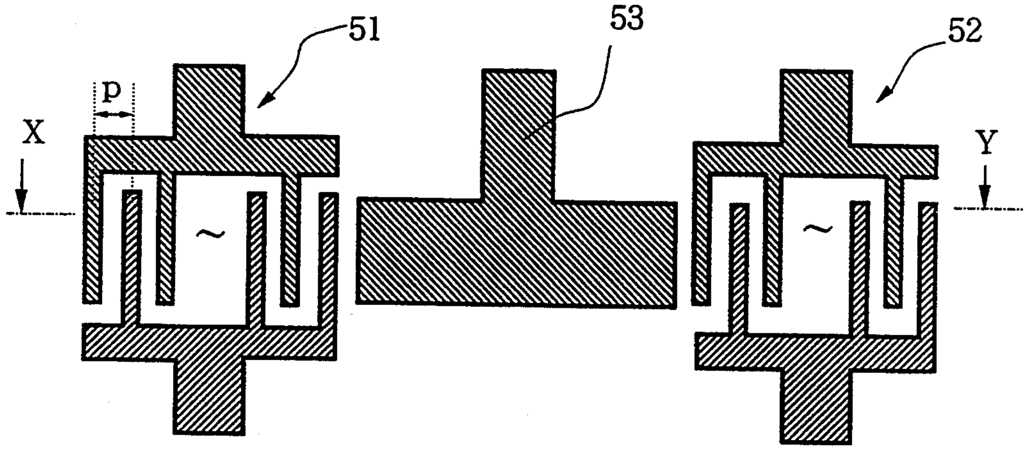
PRIOR ART FIG. 9 (a)
FIGS. 9(*a*) and 9(*b*) are a plan view and a sectional view, respectively, showing a filter using conventional surface acoustic wave transducers.
Figure 9:
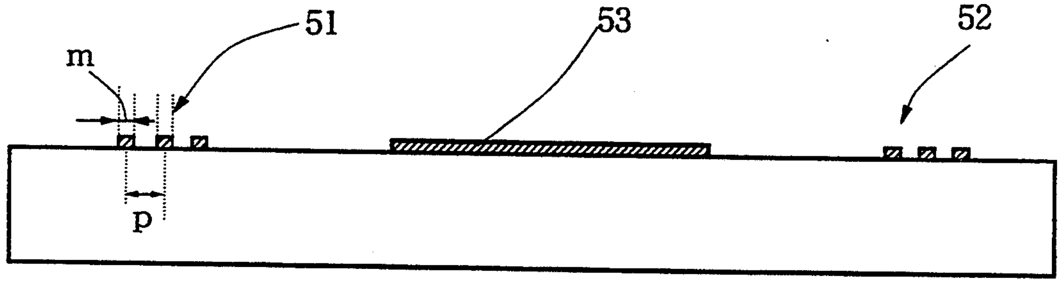
PRIOR ART FIG. 9 (b)

As shown in FIGS. 8(*a*) and 8(*b*), dummy electrodes 41 are inserted at weighting positions, and the widths formed between the positive or negative electrodes and the dummy electrodes formed on extension line of the positive or negative electrodes are uniformed, thereby aligning wave surfaces of output signals and hence improving the frequency characteristics.

EFFECT OF THE INVENTION

As has been described above, in a surface acoustic wave convolver having interdigital electrodes each having a predetermined thickness and formed on a piezoelectric or electrostrictive substrate, since one interdigital electrode has a double electrode structure in consideration of directivites of the interdigital electrodes, a surface acoustic wave convolver having high convolution efficiency and wide-range characteristics can be obtained.

In addition, an output electrode is divided into a plurality of pieces, and interdigital electrodes are weighted, so that a surface acoustic wave convolver having small ripples in the frequency characteristics can be obtained even if matching is improved to improve the convolution efficiency.

What is claimed is:

1. A surface acoustic wave convolver having first and second interdigital electrodes for exciting surface acoustic waves and an output electrode for detecting the surface acoustic waves to extract a convolution output as an electrical signal, said first and second interdigital electrodes and said output electrode being formed on a piezoelectric or electrostrictive substrate, wherein each of said first and second interdigital electrodes has a predetermined thickness, said first interdigital electrode is arranged such that positive and negative electrodes are alternately arranged so as to have electrodes widths and periods which are gradually decreased toward said output electrode, said second interdigital electrode is arranged such that positive and negative electrodes are alternately arranged so as to have electrode widths and periods which are gradually increased toward said output electrode, and said first interdigital electrode has a single electrode structure and said second interdigital electrode has a double electrode structure.

2. A convolver according to claim 1, wherein said first interdigital electrode satisfies $0.2 \leqq m/p \leqq 0.7$ and said second interdigital electrode satisfies $0.72 \leqq m/p \leqq 0/9$ wherein m is an electrode width in each of said first and second interdigital electrodes and p is a period therein.

3. A convolver according to claim 1, wherein said first interdigital electrode has a ratio Zm/Zg of less than 1 wherein Zm is an acoustic impedance of a metal film of each of said first and second interdigital electrodes, and Zg is an acoustic impedance of an electrode gap.

4. A surface acoustic wave convolver having first and second interdigital electrodes for exciting surface acoustic waves and an output electrode for detecting the surface acoustic waves to extract a convolution output as an electrical signal, said first and second interdigital electrodes and said output electrode being formed on a piezoelectric or electrostrictive substrate, wherein each of said and second interdigital electrodes has a predetermined thickness, said first interdigital electrode is arranged such that positive and negative electrodes are alternately arranged so as to have electrode widths and periods which are gradually decreased toward said output electrode, said second interdigital electrode is arranged such that positive and negative electrodes are alternately arranged so as to have electrode widths and periods which are gradually increased toward said output electrode, said output electrode is divided into a plurality of pieces, and each of said first and second interdigital electrodes is weighted at its two end portions.

5. A convolver according to claim 4, wherein said first interdigital electrode has a single electrode structure and satisfies $0.2 \leqq m/p \leqq 0.7$ and said second interdigital electrode has a single electrode structure and satisfies $0 < m/p < 0.3$ or $0.6 < m/p < 1.0$ wherein m is an electrode width in each of said first and second interdigital electrodes and p is a period therein.

6. A convolver according to claim 4, wherein said first interdigital electrode has a single electrode structure and said second interdigital electrode has a double electrode structure.

7. A convolver according to claim 6, wherein said first interdigital electrode satisfies $0.2 \leqq m/p \leqq 0.7$ and said second interdigital electrode satisfies $0.6 < m/p < 1.0$ wherein m is an electrode width in each of said first and second interdigital electrodes and P is a period therein.

8. A convolver according to claim 4, wherein overlap widths of said positive and negative electrodes at said two end portions of said first and second interdigital electrodes are gradually reduced from central sides to end sides, thereby weighting said two end portions.

9. A convolver according to claim 4, wherein said first interdigital electrode has a ratio Zm/Zg of less than 1 and said second interdigital electrode has a ratio Zm/Zg of more than 1 wherein Zm is an acoustic impedance of a metal film of each of said first ands second interdigital electrodes, and Zg is an acoustic impedance of an electrode gap.

10. A convolver according to claim 4, wherein negative and positive dummy electrodes are formed on extension lines of said positive and negative electrodes of said two end portions of said first and second interdigital electrodes.

11. A convolver according to claim 10, wherein the opening lengths between respective pairs of positive and negative electrodes and said dummy electrodes are constant.

12. A surface acoustic wave convolver having first and second interdigital electrodes for exciting surface acoustic waves and an output electrode for detecting the surface acoustic waves to extract a convolution output as an electrical signal, said first and second interdigital electrodes and said output electrode being formed on a piezoelectric or electrostrictive substrate, wherein said first interdigital electrode has a directivity toward said output electrode, and said second interdigital electrode has bi-directional characteristics.

13. A convolver according to claim 12, wherein said output electrode is divided into a plurality of pieces, and two end portions of each of said first and second interdigital electrodes are weighted.

14. A convolver according to claim 13, wherein overlap widths of said positive and negative electrodes at said two end portions of said first and second interdigital electrodes are gradually reduced from central sides to end sides, thereby weighting said two end portions.

15. A convolver according to claim 14, wherein negative and positive dummy electrodes are formed on extension lines of said positive and negative electrodes of said two end portions of said first and second interdigital electrodes.

16. A convolver according to claim 10, wherein the opening lengths between respective pairs of positive and negative electrodes and said dummy electrodes are constant.

17. A convolver according to claim 12, wherein said first interdigital electrode has a single electrode structure and said second interdigital electrode has a double electrode structure.

18. A convolver according to claim 17, wherein said output electrode is divided into a plurality of pieces.

19. A convolver according to claim 18, wherein overlap widths of said positive and negative electrodes at two end portions of each of said first and second interdigital electrodes are gradually reduced from central sides to end sides, thereby weighting said two end portions.

20. A convolver according to claim 19, wherein negative and positive dummy electrodes are formed on extension lines of said positive and negative electrodes of said two end portions of said first and second interdigital electrodes and the opening lengths between respective pairs of positive and negative electrodes and said dummy electrodes are constant.

* * * * *